(12) United States Patent
Liu

(10) Patent No.: US 6,678,160 B1
(45) Date of Patent: Jan. 13, 2004

(54) HEAT SINK ASSEMBLY INCLUDING CLIP

(75) Inventor: HenBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/303,095

(22) Filed: Nov. 22, 2002

(30) Foreign Application Priority Data

Sep. 17, 2002 (TW) ..................................... 91214616 U

(51) Int. Cl.[7] .................................................. H05K 7/20
(52) U.S. Cl. ........................ 361/719; 24/457; 248/510; 257/719; 361/703
(58) Field of Search .......................... 24/453, 457, 458, 24/624; 267/150, 158, 160; 248/505, 510; 174/16.3; 165/80.3, 185; 257/718, 719, 722, 726, 727; 361/687, 703, 704, 709–712, 717–720

(56) References Cited

U.S. PATENT DOCUMENTS 6,430,049 B1 * 8/2002 Lai et al. ..................... 361/704
6,466,443 B1 * 10/2002 Chen .......................... 361/695

OTHER PUBLICATIONS

USPGPUB 2002/0060064 A1, Yu, Dec. 26, 2000.*

* cited by examiner

Primary Examiner—G P Tolin
(74) Attorney, Agent, or Firm—Wei Te Chung

(57) ABSTRACT

A heat sink assembly includes a clip (10), a heat sink (50), and a retention module (60). The clip has two main bodies (20) and a beam portion (40). The beam portion includes a top plate (42), a side plate (44), and a connecting plate (48). Two through slots (49) are defined in opposite ends of the connecting plate (48). Two mounting slots (43) are defined in opposite ends of the top plate. Each main body includes a first leg (26), a central pressing portion (22), and a connecting portion (28). The connecting portion passes through a corresponding through slot, and is snappingly received in a corresponding mounting slot. Two recessed portions (56) are defined at opposite sides of the heat sink. The pressing portions are for pressing on the recessed portions. The retention module engagingly receives the first legs, and second legs of the beam portion.

19 Claims, 4 Drawing Sheets

HEAT SINK ASSEMBLY INCLUDING CLIP

BACKGROUND OF THE INVENTION

1. Field of the Invention

The present invention relates to a heat sink assembly, and more particularly to a clip which easily and securely mounts a heat sink in a retention module.

2. Description of Related Art

A computer central processing unit (CPU) is the core administrator of electrical signals in most contemporary personal computers. Continued development of CPUs has enabled them to perform more and more functions. Heat generated by CPUs has increased commensurately. Such heat can adversely affect the operational stability of computers. Measures must be taken to efficiently remove the heat from the CPU. Typically, a heat sink having great heat conductivity is mounted on the CPU to remove heat therefrom. A clip is frequently used to firmly attach the heat sink to the CPU, thus achieving greater efficiency of heat dissipation.

A conventional clip for fastening a heat sink to a CPU is found in Taiwan Patent Application No. 89216225. The clip is formed from a single plate, and has a generally M-shaped profile. The clip defines opposite slots engagingly receiving ears of a socket, and thereby attaches the heat sink to an upper surface of the CPU. However, modern heat sinks are frequently very large. A single clip received in a middle of the heat sink may not be strong enough to securely fasten the heat sink on the surface of the CPU. The heat sink is liable to be displaced relative to the upper surface of the CPU when the assembly is subjected to vibration or shock during use.

Another kind of clip has been devised to overcome the above-described problems. As shown in Taiwan Application Patent No. 90208825, the clip includes a pressing portion, a pair of operating portions, and a pair of mounting portions. The operating portions are used to connect the mounting portions on the pressing portion. The mounting portions each comprise a pair of spaced hooks that cooperate with the retention module to mount the heat sink in the retention module. Unfortunately, such structure is too complex, and is inconvenient for mass production, assembly and transportation. Additionally, when one end of each mounting portion is mounted on the pressing portion, the opposite end of the mounting portion is liable to rise. This causes inconvenience when mounting the heat sink on the CPU.

SUMMARY OF THE INVENTION

Accordingly, an object of the present invention is to provide a heat sink assembly including a clip which can conveniently mount a heat sink to an electronic package such as a CPU.

Another object of the present invention is to provide a clip which securely mounts a heat sink in a retention module.

In order to achieve the objects set out above, a heat sink assembly of the present invention includes a clip, a heat sink, and a retention module. The clip has two main bodies and a beam portion. The beam portion includes a top plate, a side plate, and a connecting plate interconnecting the top and side plates. A pair of through slots is defined in opposite ends respectively of a vertical portion of the connecting plate. A pair of mounting slots is defined in opposite ends respectively of the top plate, corresponding to the through slots. Each main body includes a first leg, a central pressing portion, and a connecting portion. The connecting portion passes through a corresponding through slot of the connecting plate, and is snappingly received in a corresponding mounting slot of the connecting plate. A pair of recessed portions is defined at opposite sides of the heat sink. The pressing portions of the main bodies of the clip are for pressing on the recessed portions. The retention module engagingly receives the first legs of the main bodies and second legs of the beam portion. Thus the clip in cooperation with the retention module can securely mount the heat sink on an electronic package.

Other objects, advantages and novel features of the present invention will become more apparent from the following detailed description when taken in conjunction with the accompanying drawings, in which:

DETAILED DESCRIPTION OF THE INVENTION

Figure 1:
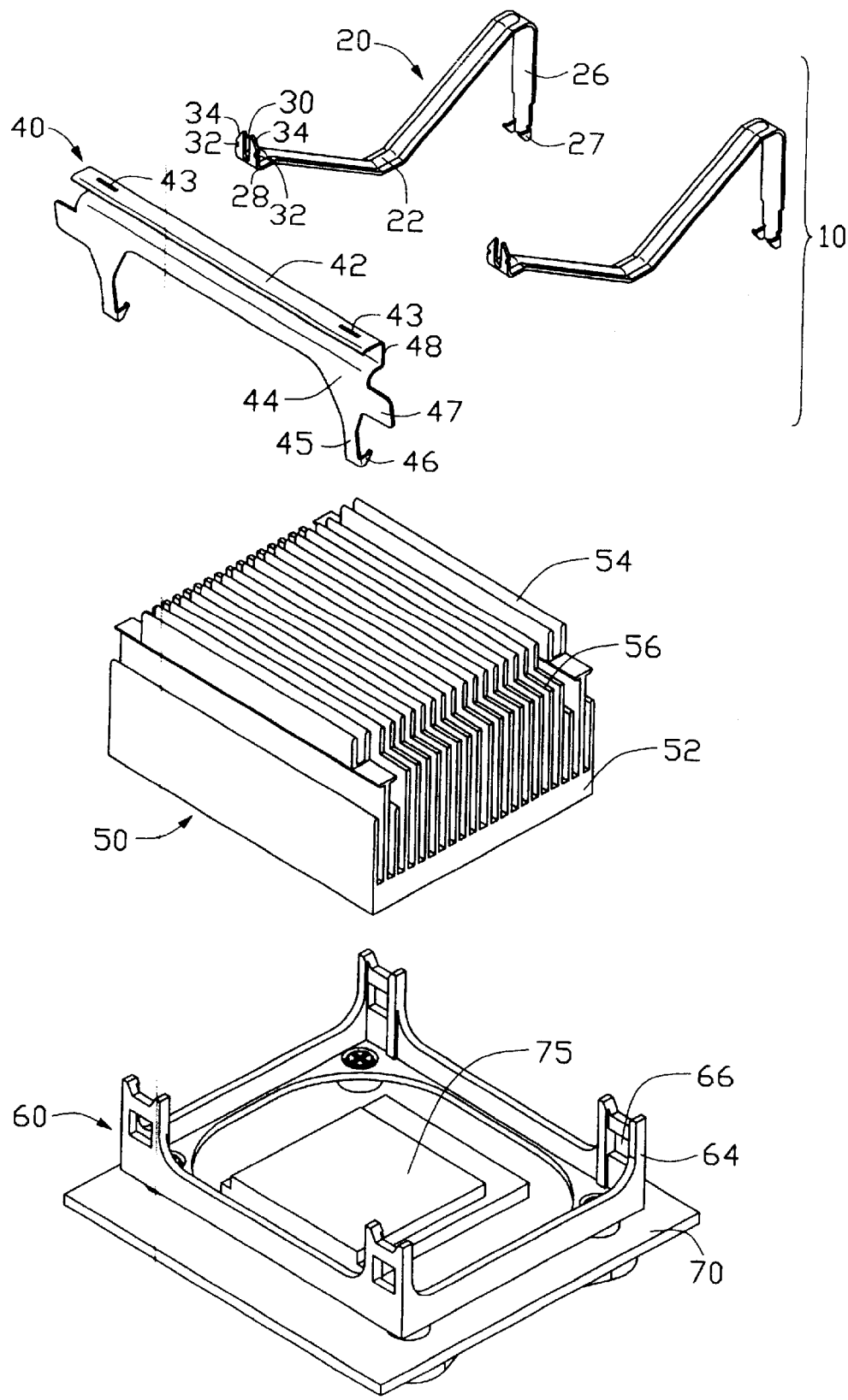
FIG. 1 is an exploded isometric view of a heat sink assembly including a clip in accordance with the present invention.

Reference will now be made to the drawing figures to describe a preferred embodiment of the present invention in detail.

Referring to FIGS. 1–4, a clip 10 in accordance with the preferred embodiment of the present invention cooperates with a retention module 60 for mounting a heat sink 50 on an electronic package 75 installed on a printed circuit board (PCB) 70.

The clip 10 includes a pair of main bodies 20 and a beam portion 40. Each main body 40 has a central pressing portion 22. The pressing portion 22 is generally arcuate, which enables it to resiliently press the heat sink 50. A first leg 26 and a connecting portion 28 extend from opposite ends of the pressing portion 22 respectively. The first leg 26 extends downwardly from the pressing portion 22. A pair of spaced first hooks 27 is inwardly formed at a free end of the first leg 26. The connecting portion 28 extends upwardly from the pressing portion 22. A cutout 30 is defined in a middle of the connecting portion 28. A free end of the connecting portion 28 is tapered to form a pair of guiding parts 34. A pair of cavities 32 is defined in opposite edges of the connecting portion 28 under the guiding parts 34 respectively.

The beam portion 40 includes a top plate 42, a side plate 44, and a connecting plate 48 interconnecting the top and side plates 42, 44. The connecting plate 48 has a generally L-shaped profile, and perpendicularly depends from the top plate 42. A pair of through slots 49 is defined in opposite ends respectively of a vertical portion of the connecting plate 48. A pair of mounting slots 43 is defined in opposite ends respectively of the top plate 42, corresponding to the through slots 49. A width of each through slot 49 is substantially equal to a corresponding width of either of the connecting portions 28. A width of each mounting slot 43 is substantially equal to a corresponding narrowed width of either of the connecting portions 28 at the cavities 32. A pair of second legs 45 depends from opposite ends of the side plate 44 respectively. A pair of second hooks 46 is inwardly formed from free ends of the second legs 45 respectively. A pair of handles 47 extends coplanarly outwardly in respective opposite directions from the opposite ends of the side plate 44.

The heat sink 50 includes a chassis 52, and a plurality of parallel fins 54 extending upwardly from the chassis 52. Top portions of opposite ends of each fin 54 are cut away to respectively form a pair of indented portions. The indented portions of the heat sink fins 54 thus cooperatively form a pair of recessed portions 56 at respective opposite sides of the heat sink 50.

The retention module 60 is fixed on the PCB 70 around the electronic package 75. Two spaced protrusions 64 extend upwardly from each of opposite sides of the retention module 60. A hole 66 is defined in each protrusion 64. The holes 66 can receive corresponding first hooks 27 of the main bodies 20 and second hooks 46 of the beam portion 40.

Figure 2:
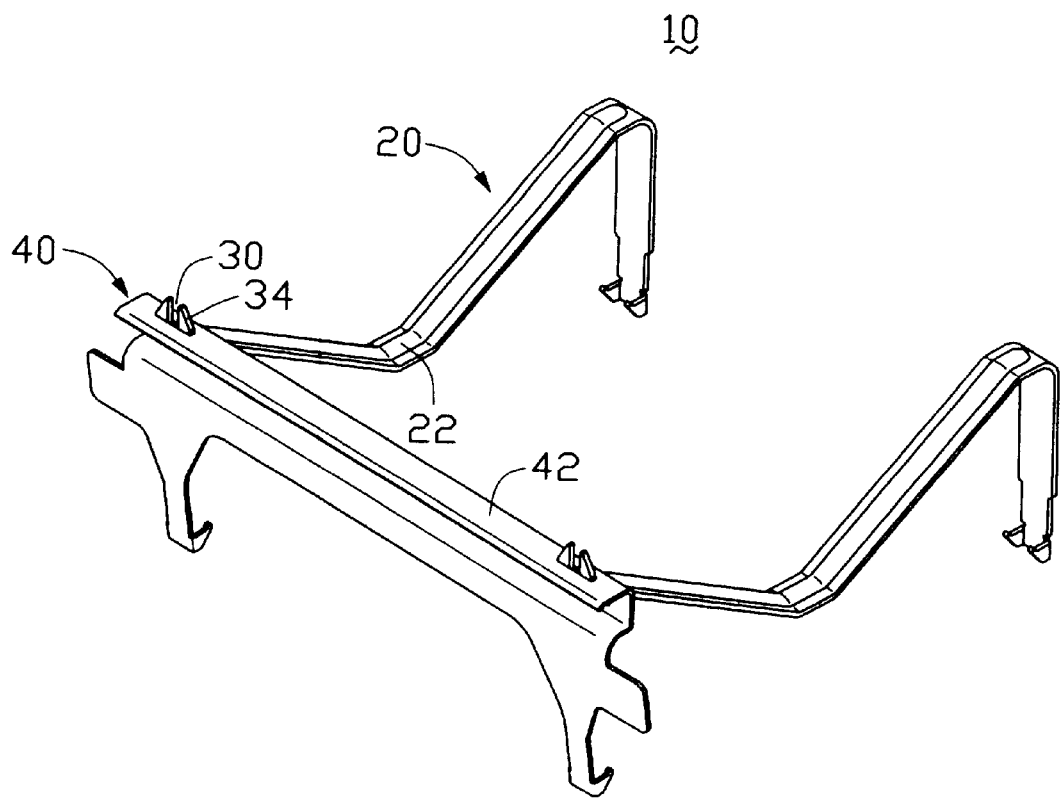
FIG. 2 is an assembled view of the clip of the heat sink assembly of FIG. 1.
Figure 3:
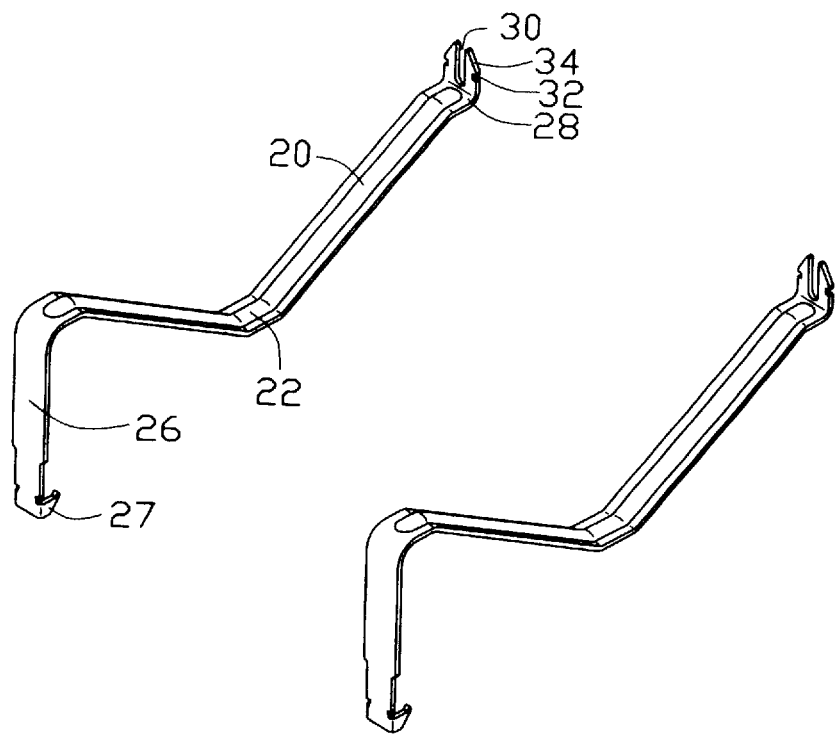
FIG. 3 is an isometric view of a pair of main bodies of the clip of the heat sink assembly of FIG. 1, but viewed from another aspect.
Figure 4:
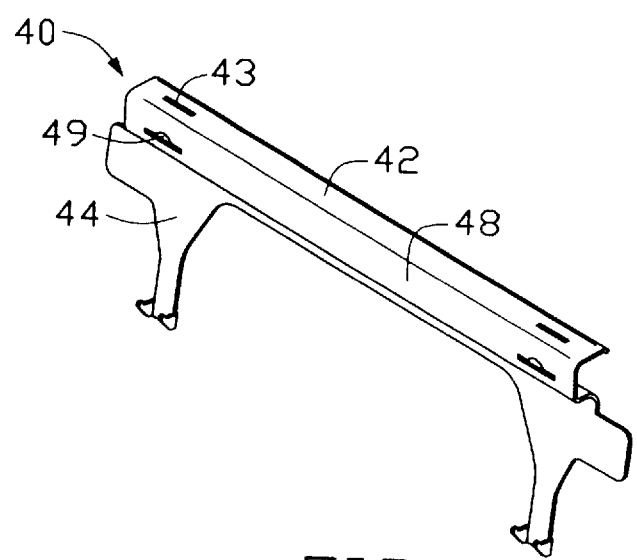
FIG. 4 is an isometric view of a beam portion of the clip of the heat sink assembly of FIG. 1, but viewed from another aspect.
Figure 5:
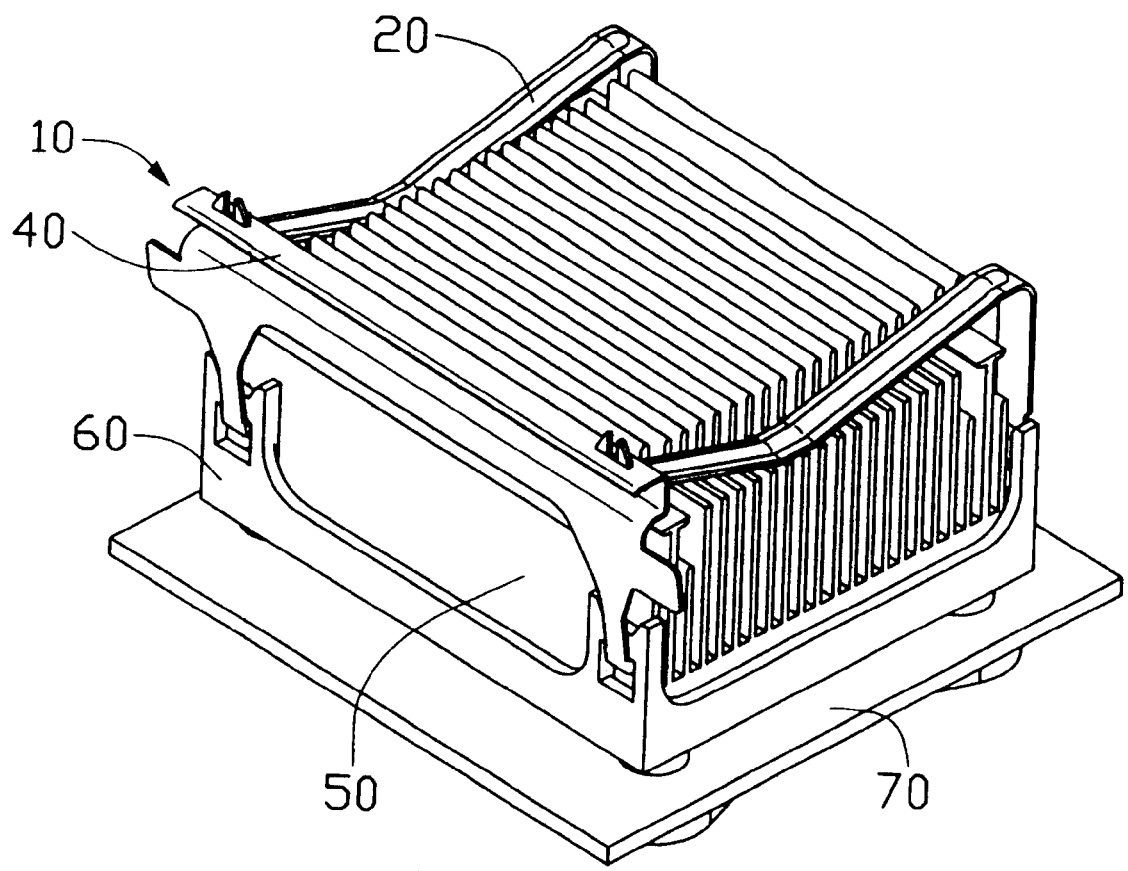
FIG. 5 is an assembled view of FIG. 1.

Referring particularly to FIGS. 1, 2 and 5, in assembly, the connecting portion 28 of each main body 20 is passed through a corresponding through slot 49 of the connecting plate 48, and then through the corresponding mounting slot 43 of the top plate 42. When the connecting portion 28 is passed through the mounting slot 43, the guiding parts 34 of the connecting portion 28 are resiliently squeezed toward each other at the cutout 30. The connecting portion 28 at the cavities 32 is accordingly snappingly received in the mounting slot 43. Thus both main bodies 20 are attached to the beam portion 40.

The heat sink 50 is placed in the retention module 60, with the chassis 52 contacting the electronic package 75. The clip 10 is placed on the heat sink 50. The two pressing portions 22 of the clip 10 rest on the recessed portions 56 of the heat sink 50 respectively. The second hooks 46 of the beam portion 40 and the first hooks 27 of the main bodies 20 are aligned with the corresponding holes 66 of the retention module 60. The first hooks 27 of the main bodies 20 are inserted into the corresponding holes 66. The top plate 42 is pressed downwardly, and the second hooks 46 of the beam portion 40 are resiliently engaged in the corresponding holes 66 of the retention module 60. Thus, the heat sink assembly is fully assembled.

In disassembly, the top plate 42 is pushed downwardly and the handles 47 are simultaneously pulled outwardly. This enables the second hooks 46 of the beam portion 40 to escape from the corresponding holes 66 of the retention module 60. Then the first hooks 27 of the main bodies 20 are easily removed from the corresponding holes 66 of the retention module 60. The clip 10 is then easily removed from the retention module 60 and the heat sink 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip adapted to cooperate with a retention module to attach a heat sink to an electronic device, the clip comprising:

two main bodies each comprising a first leg adapted for engaging with the retention module, a pressing portion adapted for pressing the heat sink, and a connecting portion; and a beam portion comprising a top plate, a side plate, and a connecting plate interconnecting the top and side plates, the top plate defining two mounting apertures, the connecting plate defining two through apertures, the side plate comprising at least one second leg;

wherein the connecting portions of the main bodies are extended through the through apertures to engage in the mounting apertures thereby enabling the pressing portions to press the heat sink onto the electronic device.

2. The clip as recited in claim 1, wherein the side plate further comprises a pair of handles at respective opposite ends thereof for facilitating operation.

3. The clip as recited in claim 1, wherein the second leg defines at least one second hook at a distal end thereof.

4. The clip as recited in claim 1, wherein each of the pressing portions is generally arcuate.

5. The clip as recited in claim 1, wherein a distal end of each of the connecting portions is tapered to form a pair of guiding parts, and a pair of cavities is defined in respective opposite edges of the connecting portion under the guiding parts.

6. The clip as recited in claim 5, wherein a cutout is defined between the guiding parts.

7. The clip as recited in claim 5, wherein the guiding parts are deformably passed through a corresponding through aperture of the beam portion, and the connecting portion is engaged in a corresponding mounting aperture of the beam portion at the cavities.

8. A heat sink assembly, comprising:

a motherboard with an electronic device mounted thereon;

a retention module attached on the motherboard, the retention module defining a plurality of holes;

a heat sink attached on the electronic device in the retention module, the heat sink comprising a chassis and a plurality of fins arranged on the chassis, and defining a pair of recessed portions at opposite upper regions of the fins; and a clip comprising a pair of main bodies and a beam portion, each of the main bodies comprising a pressing portion, a first leg depending from one end of the pressing portion, and a connecting portion extending from an opposite end of the pressing portion, the first leg having at least one first hook at a distal end thereof, the beam portion connecting between ends of the main bodies, the beam portion comprising a side plate and a pair of second legs depending from opposite ends of the side plate respectively, each of the second legs having at least one second hook at a distal end thereof, the first hooks and the second hooks engaging in the holes of the retention module to mount the heat sink in the retention module.

9. The heat sink assembly as recited in claim 8, wherein the side plate further comprises a pair of handles at respective opposite ends thereof for facilitating operation.

10. The heat sink assembly as recited in claim 8, wherein a distal end of the connecting portion is tapered to form a pair of guiding parts, a pair of cavities is defined in opposite edges of the connecting portion under the guiding parts respectively, and a cutout is defined between the guiding parts.

11. The heat sink assembly as recited in claim 8, wherein the beam portion further comprises a connecting plate connecting with the side plate.

12. The heat sink assembly as recited in claim 11, wherein the connecting plate defines a pair of through apertures at respective opposite ends thereof for receiving the connecting portions of the main bodies therethrough.

13. The heat sink assembly as recited in claim 12, wherein the beam portion further comprises a top plate connecting with the connecting plate.

14. The heat sink assembly as recited in claim 13, wherein the top plate defines a pair of mounting apertures at respective opposite ends thereof corresponding to the through apertures.

15. The heat sink assembly as recited in claim 8, wherein two protrusions extend upwardly from each of opposite sides of the retention module, and the holes are respectively defined in the protrusions.

16. A heat sink assembly comprising:
   a printed circuit board with an electronic package thereon;
   a retention module located upon the printed circuit board around the electronic package with two pairs of retention sections around four corners thereof;
   a heat sink seated upon the electronic package;
   a three-piece clip including a pair of main bodies individually extending along a first direction and respectively pivotally linked with a beam portion extending in a second direction perpendicular to said first direction;
   said pair of main bodies including a pair of first hooks latched with the corresponding retention sections, respectively, on one side of the retention module;
   said beam portion including a pair of second hooks latches with the corresponding retention sections, respectively, on the other side of the retention module; wherein
   said main bodies press downwardly against the heat sink.

17. The assembly as recited in claim 16, wherein said beam portion provides a manipulating position around a middle portion thereof.

18. The assembly as recited in claim 16, wherein said beam portion provides another manipulating section which extends outwardly from one end thereof along the second direction.

19. The assembly as recited in claim 16, wherein said main bodies are located on two opposite sides of the heat sink, which are perpendicular to said two sides of the retention module.

\* \* \* \* \*